(12) United States Patent
Chen

(10) Patent No.: US 6,756,852 B2
(45) Date of Patent: Jun. 29, 2004

(54) METHOD FOR REDUCING OUTPUT NOISE OF A POWER AMPLIFIER

(75) Inventor: Shen-Whan Chen, Taipei (TW)

(73) Assignee: Gatax Technology Co., Ltd., Taipei (TW)

(*) Notice: Subject to any disclaimer, the term of this patent is extended or adjusted under 35 U.S.C. 154(b) by 0 days.

(21) Appl. No.: 10/249,021

(22) Filed: Mar. 11, 2003

(65) Prior Publication Data

US 2004/0046610 A1 Mar. 11, 2004

(30) Foreign Application Priority Data

Sep. 5, 2002 (TW) .................................. 91120382 A

(51) Int. Cl.[7] .............................................. H03F 3/04
(52) U.S. Cl. ...................................... 330/296; 330/285
(58) Field of Search ................................ 330/296, 285, 330/302, 310, 133, 134

(56) References Cited

U.S. PATENT DOCUMENTS 6,492,869 B1 * 12/2002 Kuriyama ................... 330/133
6,549,076 B2 *  4/2003 Kuriyama ................... 330/296
6,617,927 B2 *  9/2003 Numanami et al. ......... 330/277

FOREIGN PATENT DOCUMENTS

TW              395084         6/2000

* cited by examiner

Primary Examiner—Henry Choe
(74) Attorney, Agent, or Firm—Winston Hsu

(57) ABSTRACT

A method for reducing output noise of a power amplifier. The power amplifier is used to amplify an input signal so as to generate an output signal. The power amplifier has an input terminal, a first order circuit electrically connected to the input terminal and a first bias terminal, and a second order circuit electrically connected to a second bias terminal and an output terminal of the first order circuit. The method is capable of reducing output power of the output signal in a first frequency band and keeping output power of the output signal in a second frequency band larger than a predetermined value by adjusting a waveform of a first bias signal applied to the first bias terminal.

20 Claims, 7 Drawing Sheets

METHOD FOR REDUCING OUTPUT NOISE OF A POWER AMPLIFIER

BACKGROUND OF INVENTION

1. Field of the Invention

The present invention relates to a method for reducing output noise of a power amplifier, and more particularly to a method for reducing output power of an output signal of the power amplifier in a frequency band and keeping the output power of the output signal in another frequency band larger than a predetermined value.

2. Description of the Prior Art

In this modern information based society, wireless mobile communication has become an important channel for users to communicate or interchange data with others. For example, users use mobile phones to transmit audio signals so as to communicate or interchange knowledge with other users. Because the communication signals are transmitted with high frequency electromagnetic waves, in order to accurately receive the information carried by the communication signals, the mobile phones must have specific power amplifier to amplify the power of the communication signals. Moreover, the use of a digital signal application instead of an analog signal in wireless telephony technology has been developed, but there are still some limitations due to interference between channels. A Digital Enhanced Cordless Telecommunication (DECT) system, which digitizes the signal and utilizes a Time Division Multiple Access (TDMA) protocol, was defined by the European Telecommunications Standards Institute in 1992 in order to satisfy the increasing service density and quantity requirements.

For example, the Global System for Mobile communication 900 (GSM 900) is based on TDMA, and two frequency bands of 25 MHz each are reserved for it in a mobile unit: 890–915 MHz for transmission and 935–960 MHz for reception. These frequency bands are divided into 124 frequency channels with a spacing of 200 kHz. Moreover, according to the TDMA specification, each frequency channel is divided into 8 time slots. Each mobile phone is given one time slot for transmission and reception, so that each frequency channel can simultaneously carry eight calls and interference between the eight calls in the same frequency channel occurs rarely. However, because the prior art method for controlling the power amplifier is improper, interference between these frequency channels usually occurs.

Please refer to FIG. 1, which is a circuit diagram of a power amplifier 10 according to the prior art. The power amplifier 10 is installed in a mobile phone and is electrically connected to a communication module of the mobile phone. The communication module is used to modulate radio signals into a baseband signal according to the TDMA specification so as to transmit an input signal $V_{RF}$ to the power amplifier 10. The power amplifier 10 is used to amplify the input signal $V_{RF}$ to generate an output signal $V_{OUT}$. The power amplifier 10 comprises an input terminal 20, an input match circuit 30, a first order circuit 40, a match circuit 50, a second order circuit 60, and an output match circuit 70. The input terminal 20 is electrically connected to the output terminal of the communication module to receive the input signal $V_{RF}$. The input match circuit 30 is used to match the impedance of the communication module and first order circuit 40. The match circuit 50 is used to match the impedance of the first order circuit 40 and the second order circuit 60, and the output match circuit 70 is used to match the impedance of the second order circuit 60 and an antenna. The first order circuit 40 comprises a first bipolar junction transistor (BJT) 42, which has a base electrically connected to the input terminal 20 via the input match circuit 30 and to a first bias terminal B1 via a first bias resistance 44, a collector electrically connected to the match circuit 50 and to a power supply terminal Vcc via a first collector resistance 48, and an emitter electrically connected to the ground via a first grounded resistance 46. Similarly, the second order circuit 60 comprises a second BJT 62, which has a base electrically connected to the collector of the first BJT 42 via the match circuit 50 and to a second bias terminal B2 via a second bias resistance 64, a collector electrically connected to the output match circuit 70 and to the power supply terminal Vcc via a second collector resistance 68, and an emitter electrically connected to the ground via a second grounded resistance 66.

A bias signal $V_R$ is applied to the first bias terminal B1 and the second bias terminal B2 to activate the power amplifier 10 to amplify the input signal $V_{RF}$. Please refer to FIG. 2, which is a timing diagram of relative signals according to the prior art. The bias signal $V_B$ and the output signal $V_{OUT}$ have the same period T. The communication module periodically modulates digital data into the baseband within a given time slot T1. Within each time slot T1, the bias signal $V_B$ is pulled up from low to high so that the two BJTs 42 and 62 are turned on. When the two BJTs 42 and 62 are turned on, the power amplifier 10 begins to amplify the input signal $V_{RF}$ to output the amplified output signal $V_{OUT}$ If the power that the input signal $V_{RF}$ provides to the power amplifier 10 is defined as an input power $P_{RF}$, and the power that the output signal $V_{OUT}$ provides is defined as an output power $P_{OUT}$, the output power $P_{OUT}$ is capable of being represented as $$\sum_{i=0}^{n} Ai(P_{RF})^i,$$

and is expressed as the equation below:

$$P_{OUT} = \sum_{i=0}^{n} A_i(P_{RF})^i = A_0 + A_1 P_{RF}^1 + A_2 P_{RF}^2 + \ldots + A_n P_{RF}^n \quad (1)$$

where the variable n is an integer greater than 2, and each of the variables $A_0$–$A_n$ is defined as a power coefficient. One of the power coefficients $A_j$ is defined as a jth power coefficient, where the variable j is an integer. For example, the power coefficient $A_3$ is defined as a third power coefficient. In theory, the output power $P_{OUT}$ is absolutely equal to $$\sum_{i=0}^{n} Ai(P_{RF})^i$$

only when the variable n approaches infinity. However, the power coefficients $A_0$–$A_n$ are arrangedindescending order, so the output power $P_{OUT}$ is usually represented as an approximation, such as $$\sum_{i=0}^{3} Ai(P_{RF})^i$$

or $$\sum_{i=0}^{5} Ai(P_{RF})^i.$$

Moreover the power coefficients $A_0$–$A_n$ are not unchanging. The operations of the inner circuit of the power amplifier 10, such as the two BJTs 42 and 62, may influence the power coefficients $A_0$–$A_n$.

According to the prior art, when the bias voltage $V_B$ is pulled up from low to high, the two BJTs 42 and 62 are turned into an active forward operating mode. However, because of the intermodulation distortion and the non-linearity of the power amplifier 10, the output signal $V_{OUT}$ has many unnecessary noises, which result in an output power $P'_{OUT}$ provided by the output signal $V_{OUT}$ within an unexpected frequency band larger than a predetermined value. Therefore, the communication within other frequency channels is interfered. Please refer to FIG. 3, which is a spectrum diagram of the output power $P'_{OUT}$. A first frequency band I, a second frequency band II, and a third frequency band III are shown in FIG. 3. Each of the three frequency bands has a bandwidth 200 kHz and respectively corresponds to a corresponding frequency channel in the TDMA system. The second frequency band II is used by the communication module, which connects to the input terminal 20, to transmit signals. Both the input signal $V_{RF}$ and the output signal $V_{OUT}$ could be represented as sums of a plurality of sine waves, and the spectrum of the input signal $V_{RF}$ is located within the second frequency band II. If the power amplifier 10 operates ideally, the spectrum of the output signal $V_{OUT}$ should be limited within the second frequency band II. However, because of the intermodulation distortion and the non-linearity of the power amplifier 10, the output signal $V_{OUT}$ has some noises that make the spectrum of the output signal $V_{OUT}$ overlap the first frequency band I and the third frequency band III.

According to the formula (1), the output power $P'_{OUT}$ and the input power $P_{RF}$ have flowing relationship:

$$P'_{OUT} = \sum_{i=0}^{n} A'_n i(P_{RF})^i = A'_0 + A'_1 P_{RF}^1 + A'_2 P_{RF}^2 + \ldots + A'_n P_{RF}^n$$

where the variables $A'_0, A'_1, A'_2, \ldots,$ and $A'_n$ are the power coefficients of the power amplifier 10 while using the prior art method to control the power amplifier 10.

The previously mentioned intermodulation distortion and the non-linearity of the power amplifier 10 influence the odd order power coefficients $A'_3, A'_5, A'_7, \ldots, A'_{2m+1}$ of the power coefficients $A'_0$–$A'_n$. However, if the odd order power coefficients $A'_3, A'_5, A'_7, \ldots, A'_{2m+1}$ are too large, the output power $P'_{OUT}$ in some corresponding frequency bands usually exceed a standard value, which result in interference with other frequency bands. FIG. 3 indicates the spectrum of the output power $P'_{OUT}$. The spectrum of the output power $P'_{OUT}$ covers the second frequency band II and extends to the first frequency band I and the third frequency band III, so the communications within the first frequency band I or within the third frequency band III are interfered by the output power $P'_{OUT}$. In theory, the output power $P'_{OUT}$ in the second frequency band II is mainly influenced by the first order power coefficient $A'_1$, the output power $P'_{OUT}$ between a first frequency $f_1$ and a second frequency $f_2$ and between a third frequency $f_3$ and a fourth frequency $f_4$ is influenced by the third order power coefficient $A'_3$, and the output power $P'_{OUT}$ between the second frequency $f_2$ and a fifth frequency $f_5$ and between the fifth frequency $f_4$ and a sixth frequency $f_6$ is influenced by the fifth order power coefficient $A'_5$. The larger the first order power coefficient $A'_1$, the larger the output power $P'_{OUT}$ in a fifth frequency band $f_7$–$f_8$. Similarly, the larger the third order power coefficient $A'_3$, the larger the output power $P'_{OUT}$ in the frequency bands $f_1$–$f_2$ and $f_3$–$f_4$. The larger the fifth order power coefficient $A'_5$, the larger the output power $P'_{OUT}$ in the frequency bands $f_2$–$f_5$ and $f_4$–$f_6$.

Because the prior art method applies the same bias voltage $V_B$ to the first order circuit 40 and the second order circuit 60, the odd power coefficients $A'_3, A'_5, A'_7, \ldots,$ and $A'_{2m+1}$ of the power coefficients $A'_0$–$A'_n$ can not be effectively decreased. Therefore, the communication quality of the mobile phone adapting the prior art method to control the power amplifier 10 is disagreeable.

SUMMARY OF INVENTION

It is therefore a primary objective of the claimed invention to provide a method for decreasing a plurality of odd power coefficients of a power amplifier by modifying bias voltages that are applied to a first order circuit and a second order circuit so as to adjust the spectrum of the output power of the power amplifier.

The power amplifier is used to amplify an input signal to generate an output signal and comprises an input terminal for inputting the input signal, a first order circuit electrically connected to a first bias terminal and the input terminal, and a second order circuit electrically connected to an output terminal of the first order circuit and a second bias terminal.

The method comprises (a) generating a first bias signal; (b) generating a second bias signal different from the first bias signal; (c) applying the first bias signal to the first bias terminal to control operations of the first order circuit and applying the second bias signal to the second bias terminal to control operations of the second order circuit; and (d) adjusting a waveform of a first bias signal to reduce output power of the output signal in a first frequency band and to keep the output power of the output signal in a fourth frequency band larger than a predetermined value.

These and other objectives and advantages of the present invention will no doubt become obvious to those of ordinary skill in the art after reading the following detailed description of the preferred embodiment that is illustrated in the various figures and drawings.

DETAILED DESCRIPTION

Figure 4:
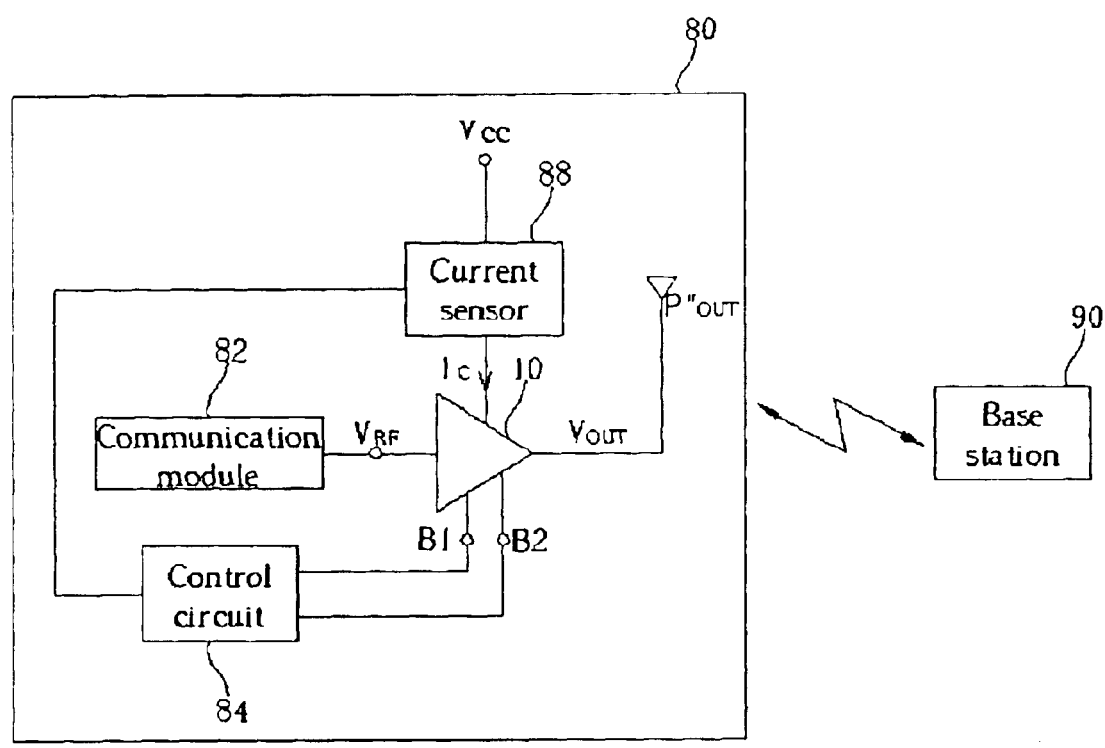
FIG. 4 is a functional diagram of a mobile phone having the power amplifier shown in FIG. 1.

Please refer to FIG. 4, which is a functional diagram of a mobile phone 80 having the power amplifier 10. The mobile phone 80 uses the present invention method to control the operations of the power amplifier 10 in FIG. 1. The power amplifier 10 is installed in the mobile phone 80 and is electrically connected to a communication module 82 of the mobile phone 80 via the input terminal 20. The communication module 82 modulates signals into a baseband signal according to the specification of the TDMA system to generate an input signal $V_{RF}$ and to transmit the input signal $V_{RF}$ to the power amplifier 10. The power amplifier 10 then amplifies the input signal $V_{RF}$ to generate an output signal $V_{OUT}$. The output signal $V_{OUT}$ is transmitted to an antenna 86 of the mobile phone 80 so that the antenna 86 radiates electromagnetic waves to the base station 90 for wireless communication.

The power amplifier 10 is electrically connected to a control circuit 84 and a current sensor 88 of the mobile phone 80. The control circuit 84 is used to output a first bias signal $V_{B1}$ and a second bias signal $V_{B2}$ to the power amplifier 10. The current sensor 88 is used to sense a current Ic flowing from the power supply terminal Vcc to the power amplifier 10. The output signal $V_{OUT}$ provides an output power $P''_{OUT}$ to the antenna 86, and the output power $P''_{OUT}$ is related to the current Ic. The larger the current Ic, the larger output power $P''_{OUT}$. Moreover, the current Ic is influenced by the voltage values of the first bias signal $V_{B1}$ and the second bias signal $V_{B2}$. The larger the voltage values of the first bias signal $V_{B1}$ and the second bias signal $V_{B2}$, the larger the current Ic. When the distance between the mobile phone 80 and the base station 90 is changed, the output power $P''_{OUT}$ must be adjusted so that the communication between the mobile phone 80 and the base station 90 is not interrupted. The control circuit 84, thus, adjusts the voltage values of the first bias signal $V_{B1}$ and the second bias signal $V_{B2}$ according to the distance between the mobile phone 80 and the base station 90 to change the output power $P''_{OUT}$. Moreover, to avoid overly adjusting the voltage values of the first bias signal $V_{B1}$ and the second bias signal $V_{B2}$, the current value of the current Ic sensed by the current sensor 88 is fed back to the control circuit 84 so that control circuit 84 can control the voltage values of the first bias signal $V_{B1}$ and the second bias signal $V_{B2}$ according to the current value of the current Ic. Therefore, when the distance between the antenna 86 and the base station 90 increases, the control circuit 84 pulls up the voltage values of the first bias signal $V_{B1}$ and the second bias signal $V_{B2}$ to increase the output power $P''_{OUT}$ so that the communication of the mobile phone 80 will not be interrupted. In the other hand, when the distance between the antenna 86 and the base station 90 decreases, the control circuit 84 pulls down the voltage values of the first bias signal $V_{B1}$ and the second bias signal $V_{B2}$ to decrease the output power $P''_{OUT}$ so as to avoid energy waste of the mobile phone 80.

Figure 5:
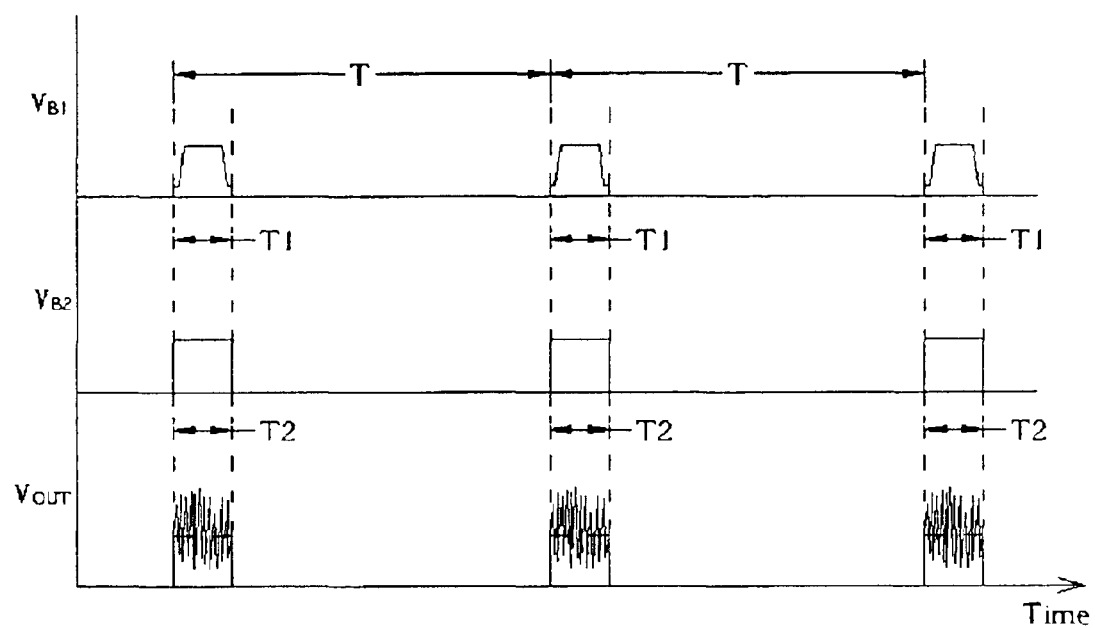
FIG. 5 is a timing diagram of relative signals of the mobile phone shown in FIG. 4.

Please refer to FIG. 5, which is a timing diagram of relative signals of the mobile phone 80 shown in FIG. 4. The first bias signal $V_{B1}$ is applied to the first bias terminal B1 of the power amplifier 10 and the second bias signal $V_{B2}$ is applied to the second bias terminal B2 of the power amplifier 10 to active the power amplifier 10 to amplify the input signal $V_{RF}$. The first bias signal $V_{B1}$, the second bias signal $V_{B2}$, and the output signal $V_{OUT}$ have the same period T. The communication module 82 periodically modulates data into the baseband signal within a given time slot T1. During the given time slot T1, the voltage values of the first bias signal $V_{B1}$ and the second bias signal $V_{B2}$ are pulled up from low to high to turn on the two BJTs 42 and 62. While the BJTs 42 and 62 are turned on, the power amplifier 10 begins to amplify the input signal $V_{RF}$ to generate the output signal $V_{OUT}$. In addition, according to the specification of the TDMA, the time period T is equal to 4616 microseconds, the time slot T1 is equal to 577 microseconds, and signals of each period T are included in a corresponding frame.

As mentioned previously, the intermodulation distortion and the non-linearity of the power amplifier 10 influence the odd order power coefficients $A_3, A_5, A_7, \ldots,$ and $A_{2m+1}$ of the power coefficients $A_0$–$A_n$, where the variable m is an integer greater than 1. If the odd order power coefficients $A_3, A_5, A_7, \ldots,$ and $A_{2m+1}$ are too large, the output power $P''_{OUT}$ in corresponding frequency bands exceeds a predetermined value. Therefore, the primary objective of the present invention is to provide a method to reduce the influence of the intermodulation distortion and the non-linearity of the power amplifier 10 by adjusting the waveform of the first bias signal $V_{B1}$ and by respectively applying the first bias signal $V_{B1}$ and the second bias signal $V_{B2}$ to the first bias terminal B1 and the second bias terminal B2 to control the operations of the two BJTs 42 and 62. The odd order power coefficients $A_3, A_5, A_7, \ldots,$ and $A_{2m+1}$, thus, can be decreased and the output power $P''_{OUT}$ in corresponding frequency bands can be kept under the predetermined value. Moreover, when the odd order power coefficients $A_3, A_5, A_7, \ldots,$ and $A_{2m+1}$ are decreased, the first power coefficients $A_1$ is kept larger than a predetermined number so that the output power $P''_{OUT}$ in the fourth frequency $f_7$–$f_8$ is larger than another predetermined value and that the mobile phone 80 can communicate with the base station 90 normally.

Figure 1:
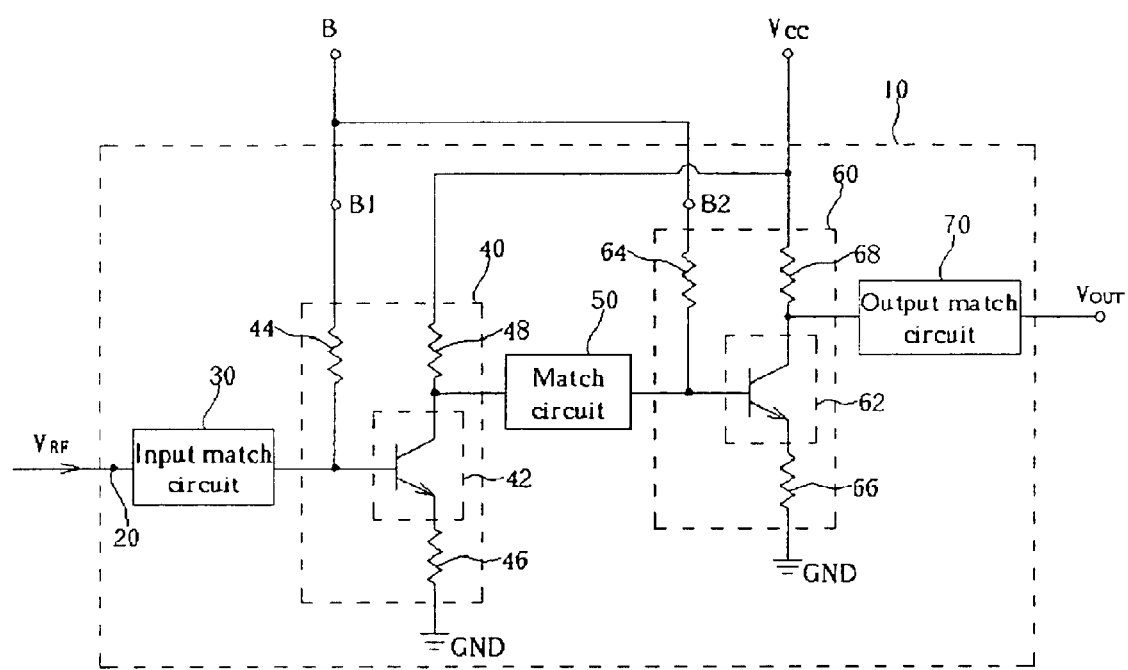
FIG. 1 is a circuit diagram of a power amplifier according to the prior art.
Figure 2:
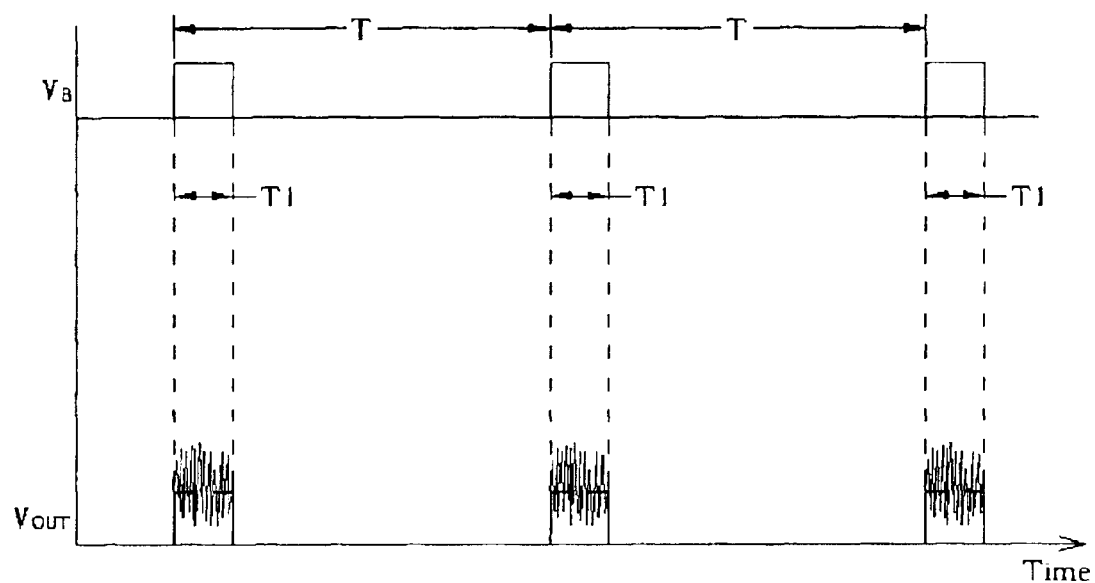
FIG. 2 is a timing diagram of relative signals according to the prior art.
Figure 6:
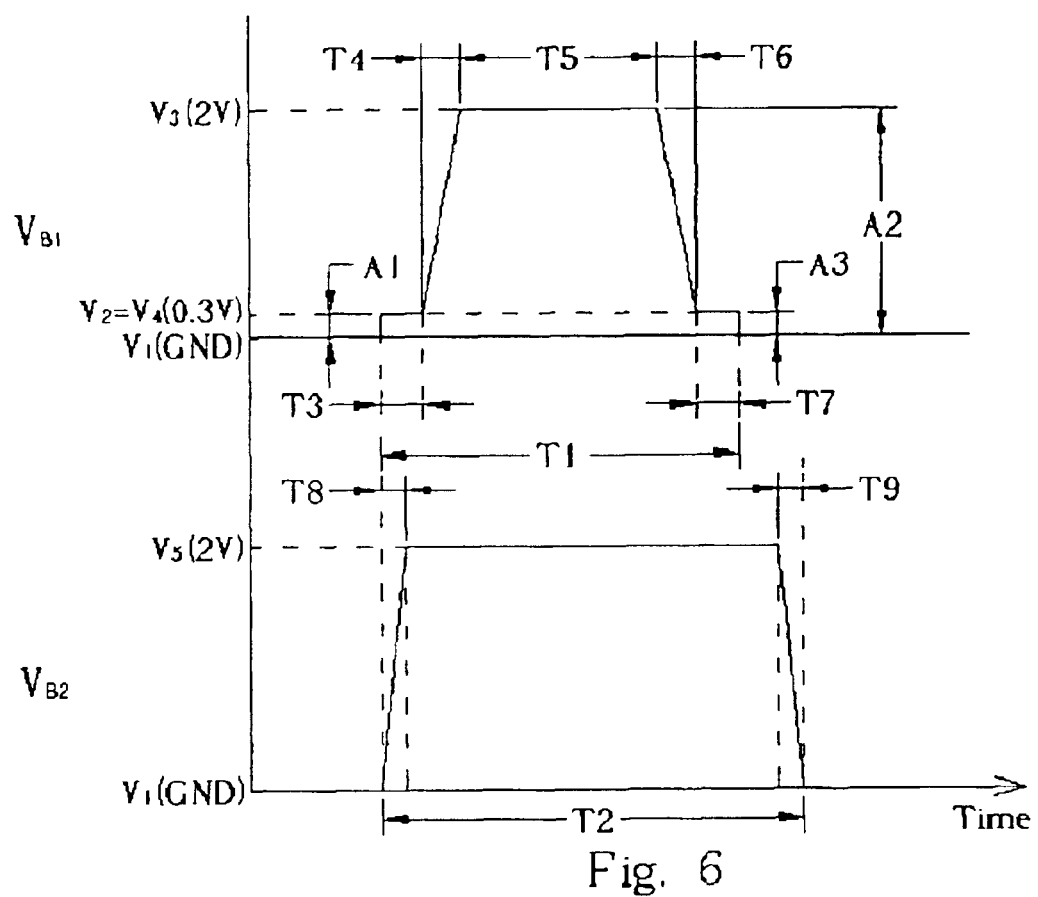
FIG. 6 is an enlarged timing diagram of a first bias signal and a second bias signal indicated in FIG. 5.

Please refer to FIG. 1, and FIG. 6. FIG. 6 is an enlarged timing diagram of the first bias signal $V_{B1}$ and the second bias signal $V_{B2}$ In the given time slot T1, the voltage values of the first bias signal $V_{B1}$ and the second bias signal $V_{B2}$ are respectively pulled up from a first voltage $V_1$ to a third voltage $V_3$ and a fifth voltage $V_5$, where the first voltage $V_1$ is equal to zero volts. The time slot T1 is divided into five periods, i.e. a period T3, a period T4, a period T5, a period T6, and a period T7. Within the period T3, the voltage value of the first bias signal $V_{B1}$ is pulled up from a first voltage $V_1$ to a second voltage $V_2$, i.e. $V_2$=0.3 volts, and then the voltage value of the first bias signal $V_{B1}$ is held at the second voltage $V_2$ for a first predetermined time interval (about 6 microseconds). Within a period T8 in the period T3 (about 1 microsecond), the voltage value of the second bias signal $V_{B2}$ is pulled up from the first voltage $V_1$ to a fifth voltage $V_5$, i. e. $V_5$=2 volts, so the bias of the base of the BJT 42 is less than the bias of the base of the BJT 62 at this time and the power amplifier 10 can be turned into a stable operating mode quickly. Within 590 microseconds after the voltage value of the second bias voltage $V_{B2}$ is pulled up to the fifth voltage $V_5$, the voltage value of the second bias voltage $V_{B2}$ is kept at the fifth voltage $V_5$. The BJT 62, thus, is in the active forward operating mode within the periods T4, T5, and T6, and the power amplifier 10 is almost kept in the stable operating mode within the time slot T1. Within the period T4 (about 5–12 microseconds), the voltage value of the first bias signal $V_{B1}$ is pulled up from the second voltage $V_2$ to the third voltage $V_3$, i.e. $V_3$=$V_5$=2 volts, then is kept at the third voltage $V_3$ within the period T5. Within the period T6 (about 5–12 microseconds), the voltage value of the first bias signal $V_{B1}$ is pulled down from the third voltage $V_3$ to a fourth voltage $V_4$, i.e. $V_4$=$V_2$=0.3 volts, and then pulled down to the first voltage $V_1$ after being kept at the fourth voltage $V_4$ within the period T7. The bias of the base of the BJT 42, thus, is less than the bias of the base of the BJT 62 within the period T7. Within a period T9 behind the time slot T1, the voltage value of the second bias signal $V_{B2}$ is pulled down from the fifth voltage $V_5$ to the first voltage $V_1$, so the BJT 62 is turned from the active forward operating mode into a cutoff mode.

The input signal $V_{RF}$ provides the power amplifier 10 with an input power $P_{RF}$. According to the formula (1), the output power $P''_{OUT}$ and the input power $P_{RF}$ have flowing relationship:

$$P''_{OUT} = \sum_{i=0}^{n} A''_n i (P_{RF})^i = A''_0 + A''_1 P^1_{RF} + A''_2 P^2_{RF} + \ldots + A'_n P^n_{RF}$$

where the variables $A''_0, A''_1, A''_2, \ldots$ and $A''_n$ are the power coefficients of the power amplifier 10 while using the method of the present invention to control the power amplifier 10.

Figure 7:
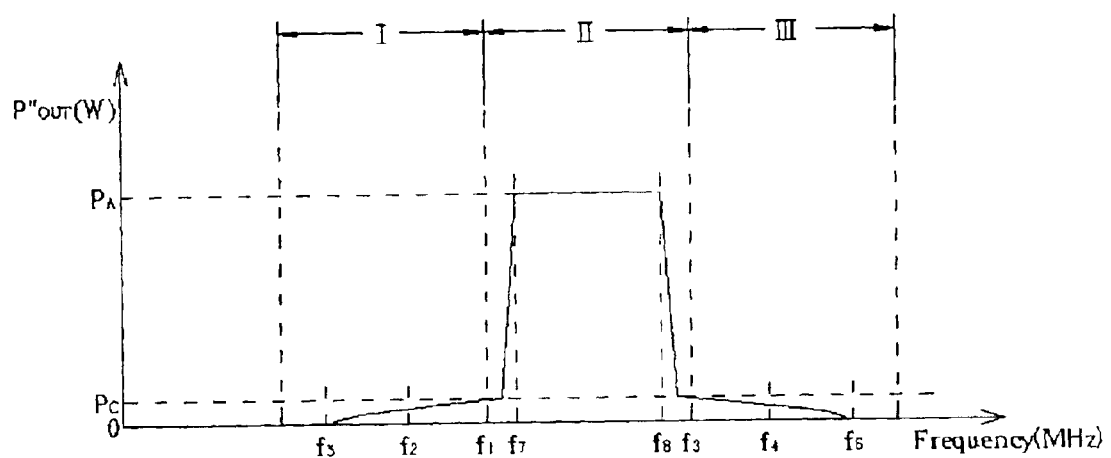
FIG. 7 is a spectrum diagram of the output power of the power amplifier in FIG. 1 according to the present invention.

Please refer to FIG. 7, which is a spectrum diagram of the output power $P''_{OUT}$ of the power amplifier 10 according to the present invention. While the first bias signal $V_{B1}$ and the second bias signal $V_{B2}$ are respectively applied to the first bias terminal B1 and the second bias terminal B2, the intermodulation distortion of the power amplifier 10 can be reduced and the odd order power coefficients $A_3$, $A_5$, $A_7, \ldots$, and $A_{2m+1}$ of the power amplifier 10 are decreased in a condition that the first order power coefficient $A_1$ is kept larger than a predetermined value. This means that the odd order power coefficients $A_3$, $A_5$, $A_7, \ldots$, and $A_{2m+1}$ are respectively decreased from $A'_3, A'_5, A'_7, \ldots$, and $A'_{2m+1}$ to $A''_3, A''_5, A''_7, \ldots$, and $A''_{2m+1}$, and that $A''_3 < A'_3$, $A''_5 < A'_5$, $A''_7 < A'_7, \ldots$, and $A''_{2m+1} < A'_{2m+1}$. A first frequency band I, a second frequency band II, and a third frequency band III are shown in FIG. 4. Each of the three frequency bands has a bandwidth 200 kHz and corresponds to a frequency channel in the TDMA system. The second frequency band II is used by the communication module 82. Both the input signal $V_{RF}$ and the output signal $V_{OUT}$ could be represented as sums of a plurality of sine waves, and the spectrum of the input signal $V_{RF}$ is located within the second frequency band II. The same as with the prior art, the output power $P''_{OUT}$ between the first frequency $f_1$ and the second frequency $f_2$ and between the third frequency $f_3$ and the fourth frequency $f_4$ is influenced by the third order power coefficient $A''_3$, and the output power $P''_{OUT}$ between the second frequency $f_2$ and the fifth frequency $f_5$ and between the fifth frequency $f_4$ and the sixth frequency $f_6$ is influenced by the fifth order power coefficient $A''_5$. However, because the third order power coefficient $A_3$ and the fifth order power coefficient $A_5$ are respectively decreased to $A''_3$ and $A''_5$, the output power $P''_{OUT}$ in the frequency bands $f_5$–$f_1$ and $f_3$–$f_6$ is decreased. Meanwhile, because the first order power coefficient $A''_1$ is kept larger than a predetermined number, the output power $P''_{OUT}$ in the fourth frequency bands $f_7$–$f_8$ is kept larger than a predetermined value $P_A$.

Figure 3:
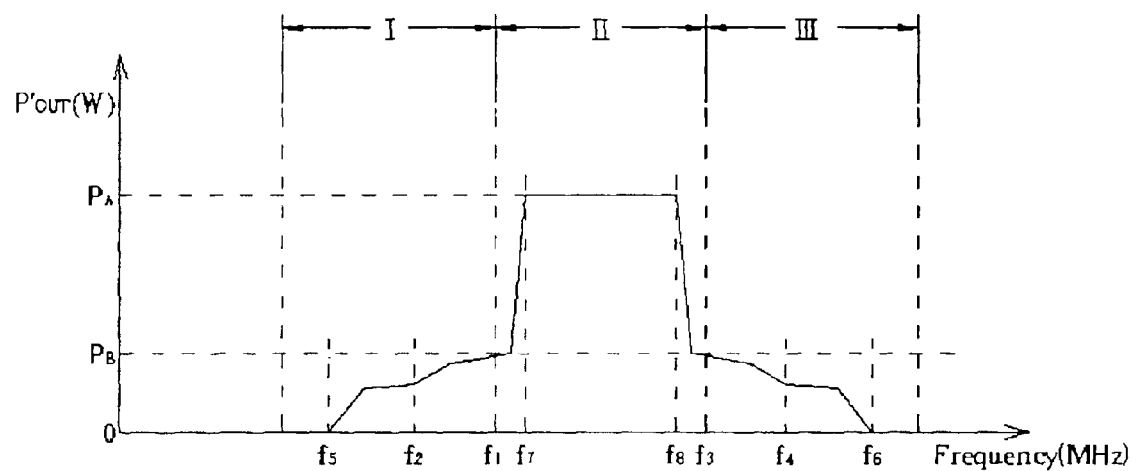
FIG. 3 is a spectrum diagram of an output power of the power amplifier in FIG. 1 according to the prior art.

Please refer to FIG. 3 and FIG. 7. In a condition that the output power $P_{OUT}$ in the fourth frequency bands $f_7$–$f_8$ must be not less than the predetermined value $P_A$, the output power $P'_{OUT}$ in the first frequency band I and in the third frequency band III according to the prior art is kept under a power $P_B$, and the output power $P''_{OUT}$ in the first frequency band I and in the third frequency band III according to the present invention is kept under a power $P_C$, where the power $P_B$ is greater than the power $P_C$. The method of the present invention, thus, can effectively decrease the output power of the power amplifier 10 in unexpected frequency bands to avoid interference.

In contrast to the prior art, the present invention keeps the first order power coefficient $A_1$ larger than a predetermined value and decreases the plurality of the odd order power coefficients $A_3, A_5, A_7, \ldots$, and $A_{2m+1}$ to reduce the output power of the power amplifier in unexpected frequency bands, so the interference with other frequency channels can be reduced and the communication quality can be improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for controlling a power amplifier, the power amplifier being used to amplify an input signal so as to generate an output signal, the input signal providing an input power $P_{RF}$, and the output signal providing an output power $P_{OUT}$, which being capable of being represented as $$\sum_{i=0}^{n} A i (P_{RF})^i,$$

where the variable n is an integer greater than 2, and each of the variables $A_0$–$A_n$ is defined as a power coefficient of the power amplifier, the power amplifier comprising:
   an input terminal for inputting the input signal;
   a first order circuit electrically connected to the input terminal and a first bias terminal; and
   a second order circuit electrically connected to a second bias terminal and an output terminal of the first order circuit;

the method comprising:
   generating a first bias signal and applying the first bias signal to the first bias terminal to control operations of the first order circuit;
   generating a second bias signal and applying the second bias signal to the second bias terminal to control operations of the second order circuit; and
   making a waveform of the first bias signal being different from a waveform of the second bias signal to decrease a third order power coefficient $A_3$ of the power coefficients $A_0$–$A_n$.

2. The method of claim 1 wherein when the third order power coefficient $A_3$ is decreased, a fifth order power coefficient $A_5$ of the power coefficients $A_0$–$A_n$ is decreased.

3. The method of claim 1 wherein as the variable n approaches infinity, when the third order power coefficient $A_3$ is decreased, a plurality of odd order power coefficients $A_{2m+1}$ of the power coefficients $A_0$–$A_n$ are decreased, where the variable m is an integer greater than 1.

4. The method of claim 1 wherein a voltage value of the first signal is pulled up from a first voltage to a second voltage and then is pulled up to a third voltage after the voltage value of the first signal is held at the second voltage for a first predetermined time interval.

5. The method of claim 4 wherein the voltage value of first bias signal is pulled down from the third voltage to a fourth voltage and then is pulled down to the first voltage after the voltage value of the first signal is held at the fourth voltage for a second predetermined time interval.

6. The method of claim 4 wherein the first voltage is equal to zero.

7. The method of claim 1 wherein a voltage value of first bias signal is pulled down from a third voltage to a fourth voltage and then is pulled down to a first voltage after the voltage value of the first signal is held at the fourth voltage for a second predetermined time interval.

8. The method of claim 7 wherein the voltage value of the first signal is pulled up from the first voltage to a second voltage and then is pulled up to the third voltage after the voltage value of the first signal is held at the second voltage for a first predetermined time interval.

9. The method of claim 7 wherein the first voltage is equal to zero.

10. The method of claim 1 wherein the power amplifier is electrically connected to a control circuit, the control circuit adjusts the first bias signal according to a distance between a base station and an antenna electrically connected to an output terminal of the power amplifier so as to adjust the magnitude of the output power $P_{OUT}$.

11. The method of claim 1 wherein the power amplifier is electrically connected to a current sensor and a control circuit, the current sensor senses a current between a power supply terminal and the power amplifier, and the control circuit adjusts the first bias signal according to the current sensed by the current sensor.

12. A method for controlling a power amplifier, the power amplifier being used to amplify an input signal to generate an output signal, the power amplifier comprising:
   an input terminal for inputting the input signal;
   a first order circuit electrically connected to the input terminal and a first bias terminal; and
   a second order circuit electrically connected to a second bias terminal and an output terminal of the first order circuit;
   the method comprising:
      generating a first bias signal;
      generating a second bias signal different from the first bias signal;
      applying the first bias signal to the first bias terminal to control operations of the first order circuit and applying the second bias signal to the second bias terminal to control operations of the second order circuit; and
      adjusting a waveform of a first bias signal to reduce output power of the output signal in a first frequency band and to keep the output power of the output signal in a fourth frequency band larger than a predetermined value.

13. The method of claim 12 wherein a voltage value of the first signal is pulled up from a first voltage to a second voltage and then is pulled up to a third voltage after the voltage value of the first signal is held at the second voltage for a first predetermined time interval.

14. The method of claim 13 wherein the voltage value of first bias signal is pulled down from the third voltage to a fourth voltage and then is pulled down to the first voltage after the voltage value of the first signal is held at the fourth voltage for a second predetermined time interval.

15. The method of claim 13 wherein the first voltage is equal to zero.

16. The method of claim 12 wherein a voltage value of first bias signal is pulled down from a third voltage to a fourth voltage, and then is pulled down to a first voltage after the voltage value of the first signal is held at the fourth voltage for a second predetermined time interval.

17. The method of claim 16 wherein the voltage value of the first signal is pulled up from the first voltage to a second voltage, and then is pulled up to the third voltage after the voltage value of the first signal is held at the second voltage for a first predetermined time interval.

18. The method of claim 16 wherein the first voltage is equal to zero.

19. The method of claim 12 wherein the power amplifier is electrically connected to a control circuit, the control circuit adjusts the first bias signal according to a distance between a base station and an antenna electrically connected to an output terminal of the power amplifier.

20. The method of claim 12 wherein the power amplifier is electrically connected to a current sensor and a control circuit, the current sensor senses a current between a power supply terminal and the power amplifier, and the control circuit adjusts the first bias signal according to the current sensed by the current sensor.

* * * * *